(12) United States Patent
Azdasht et al.

(10) Patent No.: US 8,328,068 B2
(45) Date of Patent: Dec. 11, 2012

(54) TRANSFER DEVICE FOR RECEIVING AND TRANSFERRING A SOLDER BALL ARRANGEMENT

(75) Inventors: Ghassem Azdasht, Berlin (DE); Siavash Tabrizi, Berlin (DE)

(73) Assignees: Pac Tech—Packaging Technologies GmbH, Nauen (DE); Smart Pac GmbH Technology Services, Nauen (DE)

( * ) Notice: Subject to any disclaimer, the term of this patent is extended or adjusted under 35 U.S.C. 154(b) by 0 days.

(21) Appl. No.: 12/663,329

(22) PCT Filed: Apr. 17, 2008

(86) PCT No.: PCT/DE2008/000637
§ 371 (c)(1),
(2), (4) Date: Dec. 7, 2009

(87) PCT Pub. No.: WO2008/151588
PCT Pub. Date: Dec. 18, 2008

(65) Prior Publication Data
US 2010/0213243 A1   Aug. 26, 2010

(30) Foreign Application Priority Data
Jun. 11, 2007   (DE) .......................... 10 2007 027 291

(51) Int. Cl.
*B23K 3/06* (2006.01)
*B23K 3/08* (2006.01)
(52) U.S. Cl. ............. 228/33; 228/41; 228/245; 228/246
(58) Field of Classification Search .................... 228/33, 228/41, 245–246
See application file for complete search history.

(56) References Cited

U.S. PATENT DOCUMENTS

| | | | | |
|---|---|---|---|---|
| 5,657,528 | A * | 8/1997 | Sakemi et al. | 29/430 |
| 5,680,984 | A | 10/1997 | Sakemi | |
| 6,253,985 | B1 * | 7/2001 | Kajii | 228/41 |
| 6,551,917 | B2 * | 4/2003 | Cobbley et al. | 438/613 |
| 6,638,785 | B2 * | 10/2003 | Shiozawa et al. | 438/51 |
| 7,762,446 | B2 * | 7/2010 | Zakel et al. | 228/41 |
| 2002/0179696 | A1 * | 12/2002 | Pattanaik et al. | 228/246 |
| 2006/0283012 | A1 * | 12/2006 | Lee | 29/846 |
| 2008/0302863 | A1 | 12/2008 | Zakel et al. | |

FOREIGN PATENT DOCUMENTS

| | | | |
|---|---|---|---|
| DE | 102004051983 B3 | | 4/2006 |
| JP | 10135693 A | * | 5/1998 |
| JP | 2000082874 A | * | 3/2000 |
| WO | 9720654 A1 | | 6/1997 |
| WO | 2006045266 A1 | | 5/2006 |

OTHER PUBLICATIONS

"PCT International Search Report dated Nov. 3, 2008 for PCT/DE2008/000637, from which the instant application is based," 2 pgs.

* cited by examiner

*Primary Examiner* — Devang R Patel
(74) *Attorney, Agent, or Firm* — Fredrikson & Byron, P.A.

(57) ABSTRACT

The present invention relates to a transfer device (10) for receiving and transferring a solder ball arrangement (28). Said transfer device comprises a discharge container (11) and a transfer substrate (12) that interacts with the discharge container in order to obtain a flat solder ball arrangement and that can be subjected to a negative pressure. The discharge container comprises an at least partially perforated base wall (14) and the transfer substrate has a hole pattern for receiving the solder ball arrangement. The discharge container comprises an ultrasound device (37) for subjecting said discharge container to ultrasound vibrations.

10 Claims, 3 Drawing Sheets

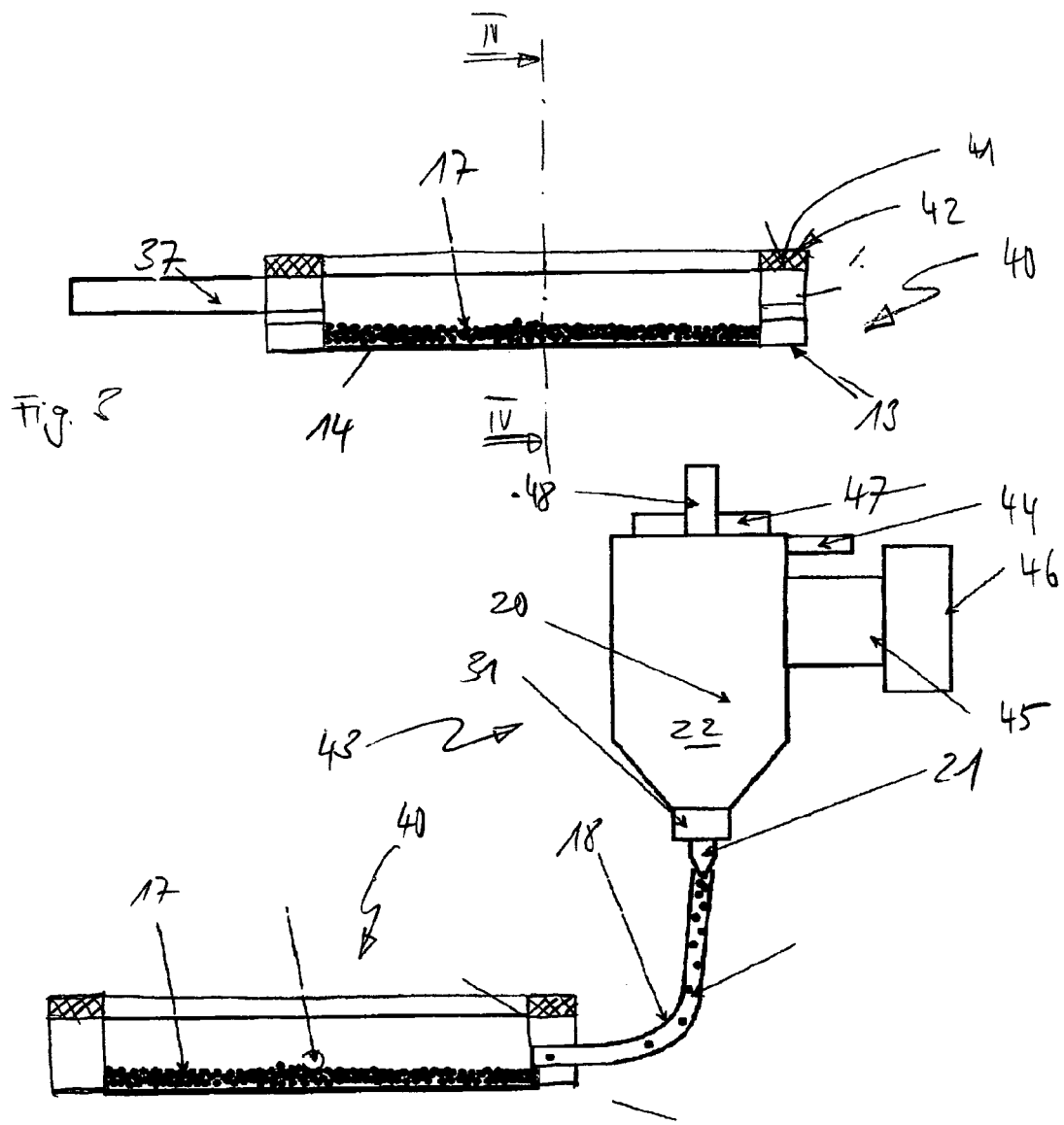

TRANSFER DEVICE FOR RECEIVING AND TRANSFERRING A SOLDER BALL ARRANGEMENT

RELATED APPLICATIONS

This application is a US 371 national stage entry of International Application No. PCT/DE2008/000637, filed Apr. 17, 2008, which claims priority to German Patent Application No. 10 2007 027 291.1, filed Jun. 11, 2007, the teachings of which are incorporated herein by reference.

The present invention relates to a transfer device for receiving and transferring a solder ball arrangement, comprising a discharge container and a transfer substrate that interacts with the discharge container in order to obtain a flat solder ball arrangement and that can be subjected to a negative pressure, wherein the discharge container comprises an at least partially perforated base wall and the transfer substrate has a hole pattern for receiving the solder ball arrangement.

A device of the aforedescribed type is known from document DE 10 2004 051 983 A1. In said known device, a transfer substrate designed as a hole template is arranged above a discharge container and can be subjected to a vacuum for sucking in solder balls disposed in a randomly distributed fashion below the transfer substrate within the discharge container and for ensuring that the solder balls are arranged in the manner corresponding to the hole pattern of the template. In order to facilitate the effect exerted by the negative pressure, the base wall of the discharge container is provided with a perforation. The evenly distributed inflow of air from a lower surface through the perforated base wall ensures a uniform ventilation, resulting in that an even distribution of the solder balls within the discharge container is not adversely affected when the transfer substrate is subjected to a vacuum, i.e. for instance centrally occurring accumulations of solder balls within the discharge container that would produce a counteractive effect on the uniform distribution of the solder balls on the transfer substrate do not form within the discharge container.

The known device thusly ensures that a distribution prevailing within the discharge container when the application of a vacuum to the transfer substrate is initiated can be substantially maintained during the process of removing solder balls from the discharge container. This, however, also means that a non-uniform distribution of the solder balls within the discharge container caused already prior to initiating the application of the vacuum, for instance due to a filling procedure performed in the discharge container, is maintained, whereby locally occurring accumulations are frequently contained precisely in a filling region. For this reason, in the case of the known device it is initially necessary to carry out a leveling of the solder ball layer disposed within the discharge container subsequent to a filling procedure performed in the discharge container. To this end, for instance a leveling of the layer surface of the solder ball layer is carried out by means of a doctor blade device.

It is an objective of the present invention to propose a device of the aforedescribed type that simplifies a leveling of the solder ball layer disposed within the discharge container.

In order to attain this objective, the inventive transfer device exhibits the features of claim 1.

In the inventive transfer device, the discharge container is provided with an ultrasound device for subjecting the discharge container to ultrasound vibrations.

Subjecting the discharge container to ultrasound vibrations ensures that any potential locally occurring accumulations in the solder ball layer resulting from a filling procedure performed in the discharge container do not occur whatsoever or are removed immediately, so that an even layer surface of the solder ball layer is ensured. Consequently, an optimum distribution of the solder balls within the discharge container can be ensured when the solder ball layer is subjected to a vacuum in order to obtain a defined solder ball arrangement on the transfer substrate. In particular, the activation of the ultrasound device represents an alternative to the doctor blade function that has to be otherwise realized either manually or else by tackling the mechanical complexity involved therein. Besides, subjecting the discharge container to ultrasound can be performed even when the transfer substrate is subjected to a vacuum and when a solder ball arrangement is formed on the transfer substrate without having a prejudicial impact thereon. Instead, subjecting the discharge container to ultrasound further facilitates the formation of the solder ball arrangement on the transfer substrate.

According to a preferred embodiment, a sealing device is interposed between the transfer substrate and the discharge container, preventing the solder balls from escaping out of the discharge container.

If a supply device for supplying an ionized gas, in particular air, is provided below the base wall of the discharge container, a static charging of the solder balls can be prevented.

According to an advantageous embodiment of the transfer device, the discharge container is connected to a solder ball reservoir via a metering device. Connecting a solder ball reservoir to the discharge container via a metering device enables an automated or self-actuated filling of the discharge container. By means of subjecting the discharge container to ultrasound it is at the same time ensured that a leveling of the filling level within the discharge container is performed directly subsequent to the filling or re-filling of the discharge container via the metering device.

In the event that, according to a particularly preferred embodiment, an outlet nozzle that can be subjected to ultrasound vibrations by means of an ultrasound device is disposed on a lower surface of the solder ball reservoir in order to obtain the metering device, the realization of a "valve function" at the metering device is enabled without the need for making use of mechanical, movable valve elements. Instead, the closing function of the "valve" is effected by the solder balls becoming jammed in the outlet channel of the outlet nozzle when the outlet nozzle is not subjected to ultrasound, resulting in that the passage running though the outlet nozzle is obstructed. Subjecting the outlet nozzle to ultrasound vibrations ensures that the solder balls abutting against one another in the outlet channel are gliding on top of one another due to the induced vibrations, so that the obstruction produced in the outlet channel is cleared by means of applying ultrasound, and a subsequent flow of solder balls disposed above the outlet nozzle within the solder ball reservoir through the outlet nozzle is enabled.

Subjecting the outlet nozzle to ultrasound can be performed directly by a direct exposure of the outlet nozzle to the ultrasound device or else indirectly by exposure of other regions or parts of the solder ball reservoir to the ultrasound device.

In the event that the metering device is connected to the discharge container via a flexible feeding pipe, subjecting the outlet nozzle to ultrasound can, where appropriate, be performed separately from subjecting the discharge container to ultrasound and vice versa. In contrast thereto, it is of course also possible to perform the application of ultrasound to the discharge container likewise simultaneously with the application of ultrasound to the outlet nozzle.

The solder ball reservoir can be equipped with a vacuum device for subjecting the solder ball reservoir to a vacuum, in particular in order to facilitate the opening operation of the "valve" defined by the outlet nozzle.

In order to facilitate an automated or self-actuated filling of the discharge container with solder balls from the solder ball reservoir, it is advantageous if the discharge container is equipped with a sensor device that interacts with the metering device in order to monitor the filling level and that, where appropriate, initiates an activation of the metering device and an opening of the outlet nozzle acting as a "valve".

It is particularly cost-efficient if a photoelectric barrier device is arranged at the discharge container at the height of the filling level in order to form the sensor device.

With respect to a particularly simple structure of the discharge container, it is advantageous if the discharge container features an annular peripheral wall that is provided with the perforated base wall.

If the perforated base wall is formed of a wire mesh, a particularly functionally reliable and cost-efficient embodiment of the discharge container can be realized.

The sealing device can be realized in a particularly simple manner if the same is configured as a sealing ring that is interposed between the peripheral wall and the transfer substrate, in particular if the same is arranged on the frontal surface of the peripheral wall.

In the following paragraphs, an embodiment of the transfer device will be described in greater detail with reference to the drawings, wherein:

FIG. 3 illustrates a further embodiment of a discharge container;

FIG. 4 illustrates the discharge container represented in FIG. 3 in a cross-sectional view along intersecting line IV-IV of FIG. 3 comprising a solder ball reservoir connected to the discharge container;

Figure 1:
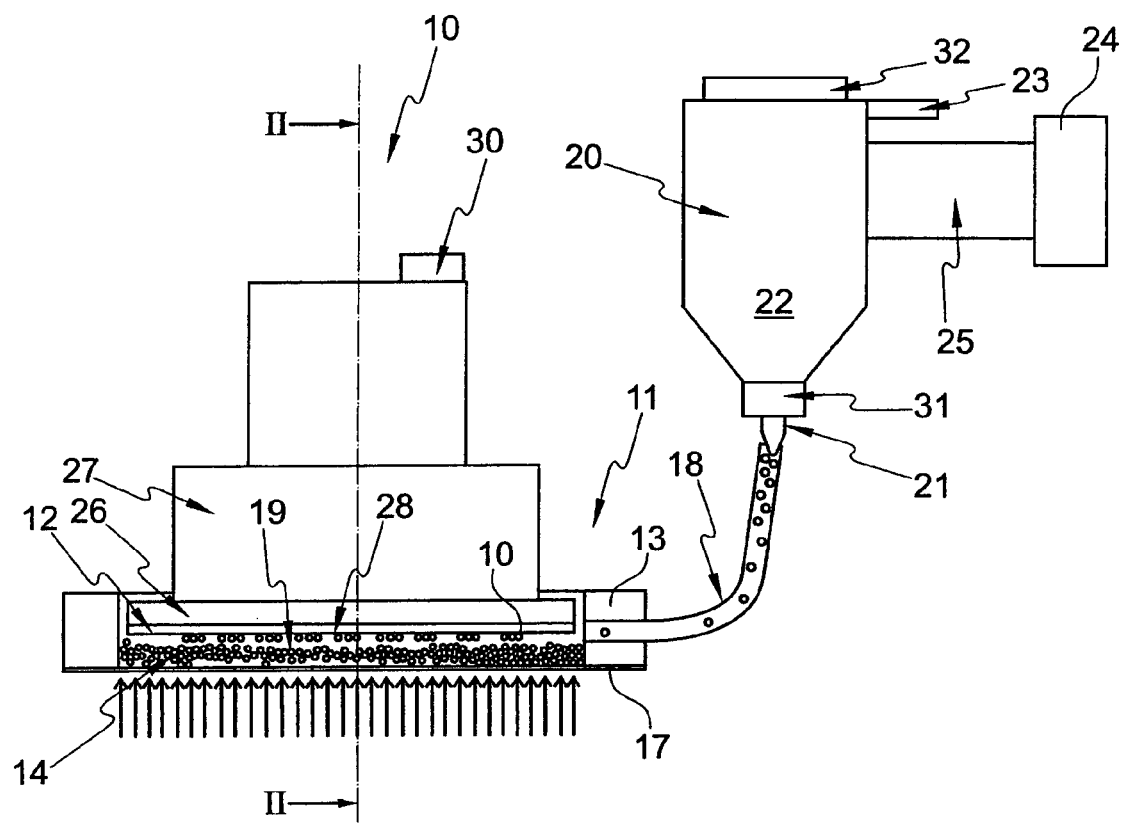
FIG. 1 illustrates a schematic view of a transfer device comprising a transfer substrate disposed within a discharge container.

FIG. 1 illustrates a transfer device 10 comprising a transfer substrate 12 disposed within a discharge container 11. The discharge container 11 has an annular peripheral wall 13 comprising a base wall 14 that forms the lower frontal surface end of the peripheral wall 13. According to the present exemplary embodiment, the base wall 14 is formed of a netted wire mesh exhibiting a mesh size that is at least slightly smaller than the diameter of the solder balls 16 disposed within the discharge container 11 and forming in their entirety a solder ball layer 17 within the discharge container 11.

By means of a feeding pipe 18 that in the present embodiment is designed in a flexible fashion, a solder ball receiving space 19 accommodating the solder ball layer 17 is connected to a solder ball reservoir 20 that forms a reserve. An outlet nozzle 21 that serves as an interface for the feeding pipe 18 is disposed on the lower surface of the solder ball reservoir 20. A solder ball storage space 22 formed within the solder ball reservoir 20 is connected to a vacuum device, not shown here in greater detail, via a vacuum connection 23. Connecting the solder ball reservoir 20 to a frame 24 is performed by means of a weighting device 25 that is, where appropriate, capable of initiating a re-filling procedure in the solder ball reservoir 20.

The transfer substrate 12 that according to FIG. 1 is disposed within the solder ball receiving space 19 is arranged on a lower surface of a connection device 26 for a manipulating device 27. The manipulating device 27, respectively a holding device accommodating the manipulating device 27, is equipped with a vacuum device, respectively a vacuum connection 30, enabling a rearward application of a vacuum to the solder ball receiving space 19 of the discharge container 11 through a hole pattern, not shown here in greater detail, formed in the transfer substrate 12. The manipulating device 27 serves for performing spatial advancing movements of the transfer substrate 12, so that on the one hand, the transfer substrate 12 can be transferred into the removal position illustrated in FIG. 1 in order to remove a solder ball arrangement 28 from the discharge container 11, and on the other hand, a transfer of the solder ball arrangement 28 disposed on the transfer substrate 12 into a contact position, not shown here in greater detail, is enabled where the solder ball arrangement 28 is positioned so as to overlap with contact points of a contact substrate. In order to make it possible that the thermal contacting of the solder ball arrangement 28 with the contact substrate can be performed in direct succession on the basis of the positioning of the solder ball arrangement 28 in a contacting position, the manipulating device 27 can also be designed as a so-called "bonding head" enabling the application of thermal energy to the solder balls.

During the operation of the transfer device illustrated in FIG. 1, subsequent to the positioning of the transfer substrate 12 in the solder ball receiving space 19 of the discharge container 11, the solder ball receiving space 19 is subjected to a vacuum applied at the vacuum connection 30. Due to the ventilation 30 performed through the perforated base wall 14 of the discharge container 11, individual solder balls 16 are transferred from the solder ball layer 17 in interaction with the vacuum in order to obtain the solder ball arrangement 28 illustrated in FIG. 1 in the hole pattern formed in the transfer substrate 12. In this process, the formation of the solder ball arrangement 28 can be additionally facilitated by means of subjecting the connection device 26 accommodating the transfer substrate 12 to ultrasound.

In order to ensure that the solder ball receiving space 19 is adequately filled, where appropriate, a filling of the solder ball receiving space 19 with solder balls 16 from the solder ball reservoir 20 is performed via the feeding pipe 18. A metering of the supply of solder balls 16 from the solder ball reservoir 20 corresponding to the respective need is performed by means of a metering device 31 that is disposed in the transitional area between the feeding pipe 18 and the solder ball reservoir 20. The metering device 31 is essentially composed of the outlet nozzle 21 and an ultrasound device 32 that subjects the outlet nozzle 21 to ultrasound. In the exemplary embodiment illustrated in FIG. 1, the ultrasound device 32 is disposed on the upper end of the solder ball reservoir 20. It is, however, also feasible to dispose the ultrasound device for instance directly at the outlet nozzle 21.

Figure 2:
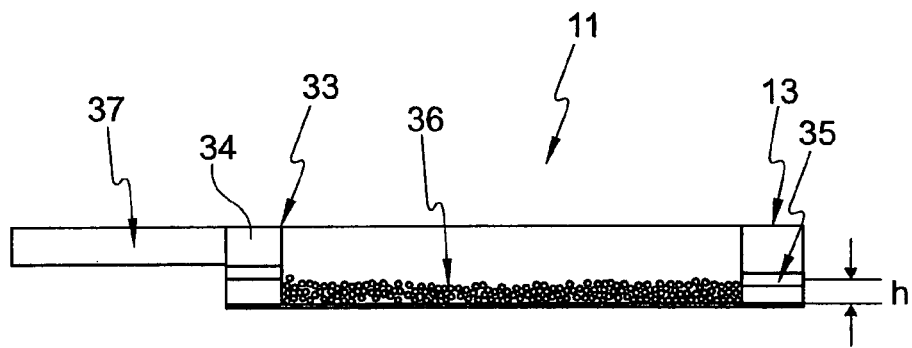
FIG. 2 illustrates the discharge container represented in FIG. 1 in a cross-sectional view along intersecting line II-II of FIG. 1.

In order to activate and control the metering device 31, as illustrated in FIG. 2, the discharge container 11 is provided with a photoelectric barrier device 33 that in the case of the present exemplary embodiment is provided with a transmitter 34 and a receiver 35, each arranged on opposing locations in the peripheral wall 13 of the discharge container 11. In the event that the height of the solder ball layer 17 formed in the solder ball receiving space 19 of the discharge container 11 falls below a filling level h defined by the photoelectric barrier device 33, a contact is established between the transmitter 34 and the receiver 35 that puts the metering device 31 into operation. In order to ensure a substantially plane-parallel or base wall parallel layer surface 36, an ultrasound device 37 that subjects the discharge container 11 to ultrasound vibrations is provided on the peripheral wall 13, hence ensuring a substantially uniform distribution of the solder balls 16, i.e. a layer surface 36 of the solder ball layer 17 that is essentially parallel to the base wall 14.

The activation of the metering device 31 is performed by means of activating the ultrasound device 32 that subjects the outlet nozzle 21 to ultrasound vibrations. The outlet nozzle 21 comprises an outlet channel, not shown here in greater detail, exhibiting an opening cross-section dimensioned in such a manner that the solder balls 16 are capable of becoming jammed in the opening cross-section in interaction with ambient parameters. The occurrence of said jamming effect can for instance be dependent on air humidity and oxygenation within the solder ball reservoir 20. Due to a nitrogen flow within the solder ball reservoir 20 and/or in the outlet channel, the oxygen supply can be reduced and the air humidity can be controlled, in particular be kept at a constant level, in order to effectively enhance the jamming effect. Moreover, the opening cross-section of the outlet channel can easily be adapted to various solder ball diameters by way of exchanging the nozzle 21, in order to thusly achieve the valve effect for various solder ball diameters.

Subjecting the outlet nozzle 21 to ultrasound causes the solder balls 16 that are disposed in the outlet channel of the outlet nozzle 21 in a jammed fashion to execute a relative movement induced by vibrations, by means of which the fixation of the solder balls 16 in the outlet channel is eliminated and a flowing of the solder balls 16 disposed within the solder ball reservoir through the nozzle 21 as well as the feeding 18 into the solder ball receiving space 19 of the discharge container 11 is enabled. As soon as the ultrasound device 32 is put out of operation again, the solder balls 16 become fixed again in the outlet channel of the outlet nozzle 21 that has a diameter dimensioned in such a manner that the occurring of any such jamming effect is enabled.

FIG. 3 illustrates a discharge container 40 that is provided with an annular peripheral wall 13, corresponding to the discharge container 11 illustrated in FIG. 2, exhibiting a base wall 14 that forms the lower frontal surface end of the peripheral wall 13 and that has the solder ball layer 17 disposed thereon. The discharge container 40 has an ultrasound device 37 disposed on the peripheral wall 13, likewise corresponding to the discharge container 11 illustrated in FIG. 2, which makes it possible to subject the discharge container 40 to ultrasound.

In contrast to the discharge container 11 illustrated in FIG. 2, the peripheral wall 13 is provided with a sealing ring 42 on an upper frontal surface 41 thereof, which in the present case is formed of a flexible material.

FIG. 4 illustrates the discharge container 40 shown in FIG. 3, to which a solder ball reservoir 43 is connected via a feeding pipe 18 that in the present case is formed in a flexible fashion. The solder ball reservoir 43 has a solder ball storing space 22 that is provided with a nitrogen inlet 44, corresponding to the solder ball reservoir 20. In contrast to the solder ball reservoir 20, the solder ball reservoir 43 is subjected to vibrations by means of an ultrasound device 46 indirectly via a bracket 45, in order to cause the outlet nozzle 21 that is connected to the metering device 31 to be subjected to ultrasound, as already discussed in connection with FIG. 1.

The solder ball reservoir 43 on an upper surface thereof is provided with a lid device 47 that enables to perform a filling procedure and that has a filling level sensor 48 that initiates a re-filling procedure or the output of a signal indicative of the need to perform a re-filling procedure when a predetermined filling level of the solder ball reservoir 43 is not reached anymore.

Figure 5:
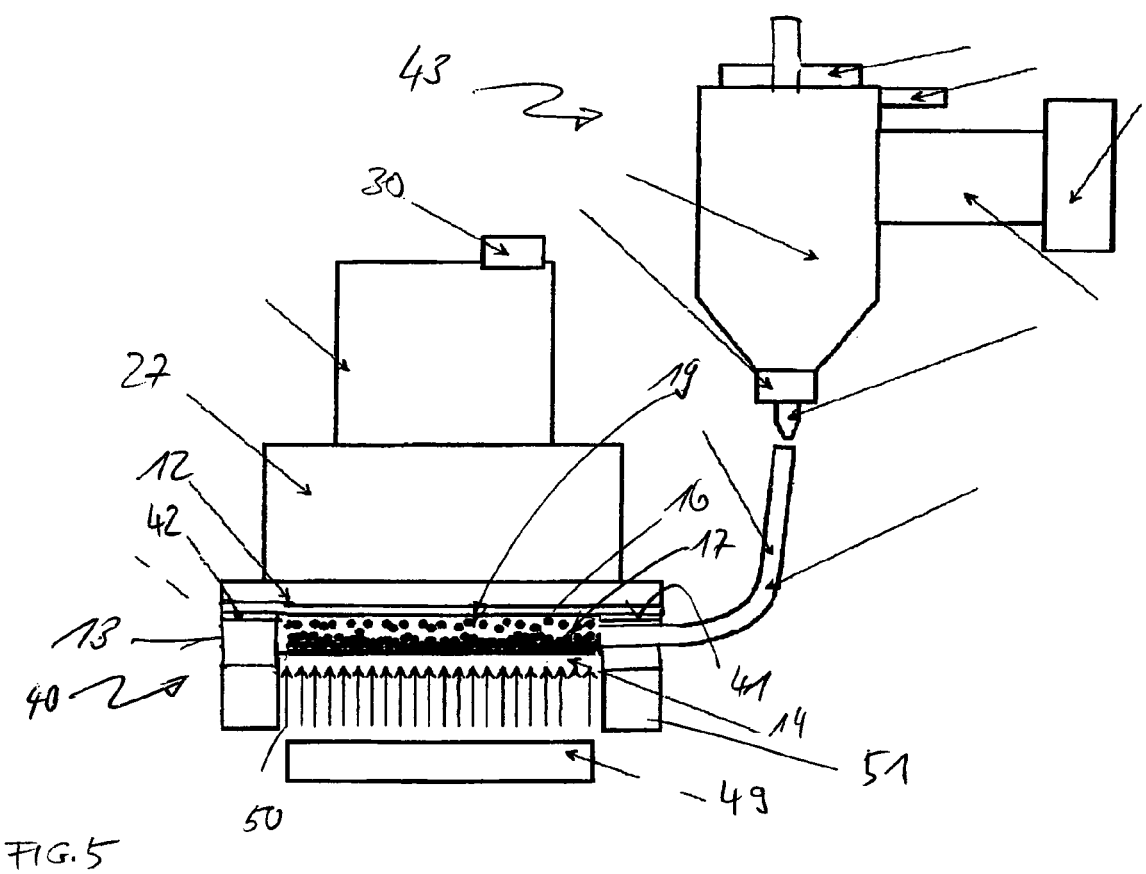
FIG. 5 illustrates the discharge container represented in FIG. 4 comprising a transfer substrate disposed on the discharge container.

FIG. 5 illustrates the discharge container 40 in combination with a transfer substrate 12 in order to enable the removal of a solder ball arrangement 28 from a solder ball receiving space 19 of the discharge container 40.

As already discussed with reference to FIG. 1, the removal of the solder ball arrangement 28 from the discharge container 40 is performed by means of subjecting the solder ball layer 17 to a vacuum using a negative pressure applied at the vacuum connection 30, resulting in that the solder balls 16 are sucked in against the transfer substrate 12 and are thereby aligned by means of the hole pattern of the transfer substrate 12 according to the desired solder ball arrangement 28 (FIG. 1).

As illustrated in FIG. 5, the transfer substrate 12 is transferred so as to abut on the frontal surface 41 of the peripheral wall 13 of the discharge container 40 when the solder ball layer 17 is subjected to a negative pressure in order to obtain a sealing, whereby the peripheral wall 13 rests on a holding device 51 and the sealing ring 42 is compressed to a greater or lesser extent. By means of the sealing, on the one hand the efficiency of the negative pressure that is applied via the vacuum connection 30 is increased and, on the other hand, the escape of solder balls 16 out of the solder ball receiving space 19 past the transfer substrate 12 to the outside of the discharge container 40 is prevented. In particular, as in the case of the embodiment illustrated in FIG. 5, if an ionized air flow 50 is introduced into the solder ball receiving space 19 by means of a supply device 49 through the base wall 14 when the solder ball layer 17 is subjected to a negative pressure in the solder ball receiving space 19, an uncontrolled escape of the solder balls 16 out of the solder ball receiving space 19 is thereby effectively prevented. At the same time, ambient air can be prevented from escaping through a gap formed between the frontal surface 41 of the peripheral wall 13 and the transfer substrate 12 to reach the solder ball receiving space 19, whereby the advantageous antistatic effect of the ionized air flow 49 could hence at least be partially annihilated or else impaired.

In the light of the aspect that the transfer device 10 illustrated in the figures primarily serves for the purpose of contacting the received solder ball arrangement 28 with chip contacts of a wafer that are positioned according to the solder ball arrangement, it is advantageous if both the discharge container 11 and the discharge container 40 can easily be adapted to various wafer sizes by means of appropriately dimensioning the annular peripheral wall 13. In this respect, an identically configured transfer substrate 12 can be employed irrespective of the wafer size, since in the embodiment illustrated in FIG. 5 the transfer substrate 12 having the interposed sealing ring 42 abuts on the discharge container 40 and thereby defines the surface area occupied by the solder ball arrangement 28 on the transfer substrate 12.

The invention claimed is:

1. A transfer device for receiving and transferring a solder ball arrangement, the device comprising:
   a discharge container having an annular peripheral wall coupled to a base wall formed of a wire mesh exhibiting a mesh size smaller than diameter of solder balls, wherein the discharge container includes a photoelectric barrier device provided with a transmitter and a receiver, each arranged on opposing locations in the peripheral wall;
   a transfer substrate that interacts with the discharge container in order to obtain a flat solder ball arrangement, the transfer substrate having a hole pattern for receiving the solder ball arrangement;
a first ultrasound device coupled to the peripheral wall of the discharge container for subjecting said discharge container to ultrasound vibrations;
a solder ball reservoir operatively coupled to the discharge container for supplying solder balls to the discharge container;
a metering device coupled to the solder ball reservoir and coupling the solder ball reservoir to the discharge container, the metering device comprising an outlet nozzle and a second ultrasound device coupled to the outlet nozzle to subject the outlet nozzle to ultrasound vibrations, wherein the metering device interacts with said photoelectric barrier device, which defines a filling level, h, of the discharge container.

2. The transfer device of claim 1 further comprising:
a sealing device interposed between the transfer substrate and the discharge container.

3. The transfer device of claim 1 further comprising:
a supply device located below the base wall for supplying an ionized gas to the discharge container.

4. The transfer device of claim 2 further comprising:
a supply device located below the base wall for supplying an ionized gas to the discharge container.

5. The transfer device of claim 1 comprising:
a flexible feeding pipe coupling the metering device to the discharge container.

6. The transfer device of claim 1 further comprising:
a vacuum device coupled to the solder ball reservoir for subjecting the solder ball reservoir to a vacuum.

7. The transfer device of claim 1 further comprising: a sealing ring interposed between the peripheral wall and the transfer substrate.

8. The transfer device of claim 7 wherein,
the sealing ring is disposed on a frontal surface of the peripheral wall facing the transfer substrate.

9. The transfer device of claim 1 further comprising:
a filling level sensor coupled to the solder ball reservoir for detecting the fill level of the solder ball reservoir.

10. The transfer device of claim 1 further comprising:
a gas inlet coupled to the solder ball reservoir for controlling the air humidity within the solder ball reservoir.

* * * * *